United States Patent
Byeon

(10) Patent No.: US 7,605,726 B2
(45) Date of Patent: Oct. 20, 2009

(54) CIRCUIT AND METHOD FOR DATA ALIGNMENT

(75) Inventor: Sang-Yeon Byeon, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 12/001,923

(22) Filed: Dec. 12, 2007

(65) Prior Publication Data

US 2008/0238512 A1    Oct. 2, 2008

(30) Foreign Application Priority Data

Mar. 30, 2007    (KR) .................... 10-2007-0031819

(51) Int. Cl.
*H03M 9/00* (2006.01)
(52) U.S. Cl. .................... 341/100; 341/101; 327/415
(58) Field of Classification Search .................. 341/100, 341/101; 327/407, 415, 291
See application file for complete search history.

(56) References Cited

U.S. PATENT DOCUMENTS

| 4,079,456 | A | * | 3/1978 | Lunsford et al. | ............ 713/401 |
| 5,721,545 | A | * | 2/1998 | Poplevine | .................... 341/100 |
| 5,726,990 | A | * | 3/1998 | Shimada et al. | ............. 327/415 |
| 6,177,891 | B1 | * | 1/2001 | Nakamura | .................... 341/100 |
| 6,696,995 | B1 | * | 2/2004 | Foley et al. | .................. 341/100 |

FOREIGN PATENT DOCUMENTS

KR    1020020086197    11/2002

* cited by examiner

*Primary Examiner*—Howard Williams
(74) *Attorney, Agent, or Firm*—Blakely, Sokoloff, Taylor & Zafman LLP

(57) ABSTRACT

A circuit for data alignment includes a first latch unit and a second latch unit. The first latch unit latches serial input data by using a plurality of first clocks with different phases and the same frequency to output latched data. The second latch unit latches the data from the first latch unit by using a plurality of second clocks with a lower frequency than the first clocks and more diverse phases to thereby output parallel data.

17 Claims, 6 Drawing Sheets

CIRCUIT AND METHOD FOR DATA ALIGNMENT

CROSS-REFERENCE TO RELATED APPLICATION

The present invention claims priority of Korean patent application number 10-2007-0031819, filed on Mar. 30, 2007, which is incorporated by reference in its entirety.

BACKGROUND OF THE INVENTION

The present invention relates to a data alignment circuit; and, more particularly, to a technology for aligning serial input data in parallel.

In order to process data between various semiconductor chips or within these chips at a high speed, the data is generally communicated between or within them by a serial interface. Then, a receiver in each chip receives the serial data and uses the same after internally aligning them in parallel. For example, a 4-bit prefetch, an 8-bit prefetch specified and so on specified in the specification of a semiconductor memory device (DRAM) define what number of data is internally made in parallel.

In general, four clocks with different phases are used for aligning serial input data into parallel data of more than 4 bits, wherein the four clocks are generated by a PLL (Phase Locked Loop). The reason of using the four clocks with different phases is to latch the serial data and parallelize the same, respectively. FIG. 1 shows that four clocks clk<0>, clk<1>, clk<2>, and clk<3> with different phases latch serial input data, respectively.

FIG. 2 is a configuration diagram illustrating a conventional circuit for data alignment.

The conventional circuit for data alignment takes serial input data from a buffer 210 and latches the data by clocks clk000, clk090, clk180, and clk270 with different phases to catch the same. Then, the timing of the data caught by each of latches 221, 222, 223, and 224 is adjusted by a timing adjustor 230 to output parallel data.

As shown in the drawing, for example, when data 0, 1, 2, and 3 are inputted in series, the data are latched by each of the latches 221, 222, 223, and 224 by using clocks clk000, clk090, clk180, and clk270 with different phases and then the timing of the latched data is adjusted, thereby outputting the data 0, 1, 2, and 3 in parallel at the same time.

At this time, the four clocks clk000, clk090, clk180, and clk270 with different phases are generally provided from a PLL.

As described above, the convention circuit for data alignment employs the four clocks with different phases so as to parallelize the serial input data in the ratio of 1:4. This 1:4 parallelization has the meaning of aligning the four data being inputted in series and outputting them in parallel (that is, of inputting data through one terminal and outputting them through four terminals). In this case, the frequency of the clocks with different phases used therein is lower than that of the data. Typically, as a clock has a lower frequency, the characteristics of jitter become deteriorated. Therefore, the use of the conventional method causes damage to the characteristics of jitter.

In addition, due to coupling noise and the like between lines in the process of delivering the four clocks with different phases generated by the PLL from the PLL to the circuit for data alignment, there is a problem that the skew between the clocks becomes bad.

In particular, in a GDDR memory device using the circuit for data alignment, 32 or more data are often aligned in parallel. In this case, however, since the number of clocks used and the number of lines for delivery thereof are large, the jitter and skew problems becomes more serious.

SUMMARY OF THE INVENTION

Embodiments of the present invention are directed to provide a circuit for aligning serial input data in parallel for improving jitter characteristics and a clock skew and reducing chip size.

In accordance with an aspect of the present invention, there is provided a circuit for data alignment including a first latch unit and a second latch unit. The first latch unit latches serial input data by using a plurality of first clocks with different phases and the same frequency to output latched data. The second latch unit latches the data from the first latch unit by using a plurality of second clocks with a lower frequency than the first clocks and more diverse phases to thereby output parallel data.

In accordance with another aspect of the present invention, there is provided a circuit for data alignment including a first latch unit and a second latch unit. The first latch unit latches serial input data by using clocks and inverted clocks from outside to output latched data. The second latch unit latches the data from the first latch unit by using four second clocks with half frequency of the clocks and different phases to thereby output parallel data.

In accordance with a further another aspect of the present invention, there is provided a method for data alignment including latching serial input data in a first latch unit using a plurality of first clocks with different phases and the same frequency and latching the data latched in the first latch unit by using a plurality of second clocks with a lower frequency than the first clocks and more diverse phases to thereby output parallel data.

BRIEF DESCRIPTION OF THE DRAWINGS

FIGS. 4A, 4B, and 4C are detailed diagrams of the divider shown in FIG. 3, in which FIG. 4A is a circuit diagram for frequency conversion, FIG. 4B is a circuit diagram for phase conversion, and FIG. 4C describes the overall operation of the divider.

DESCRIPTION OF SPECIFIC EMBODIMENTS

Hereinafter, preferred embodiments of the present invention will be described in detail with reference to the accompanying drawings so that the invention can be easily carried out by those skilled in the art.

Figure 3:
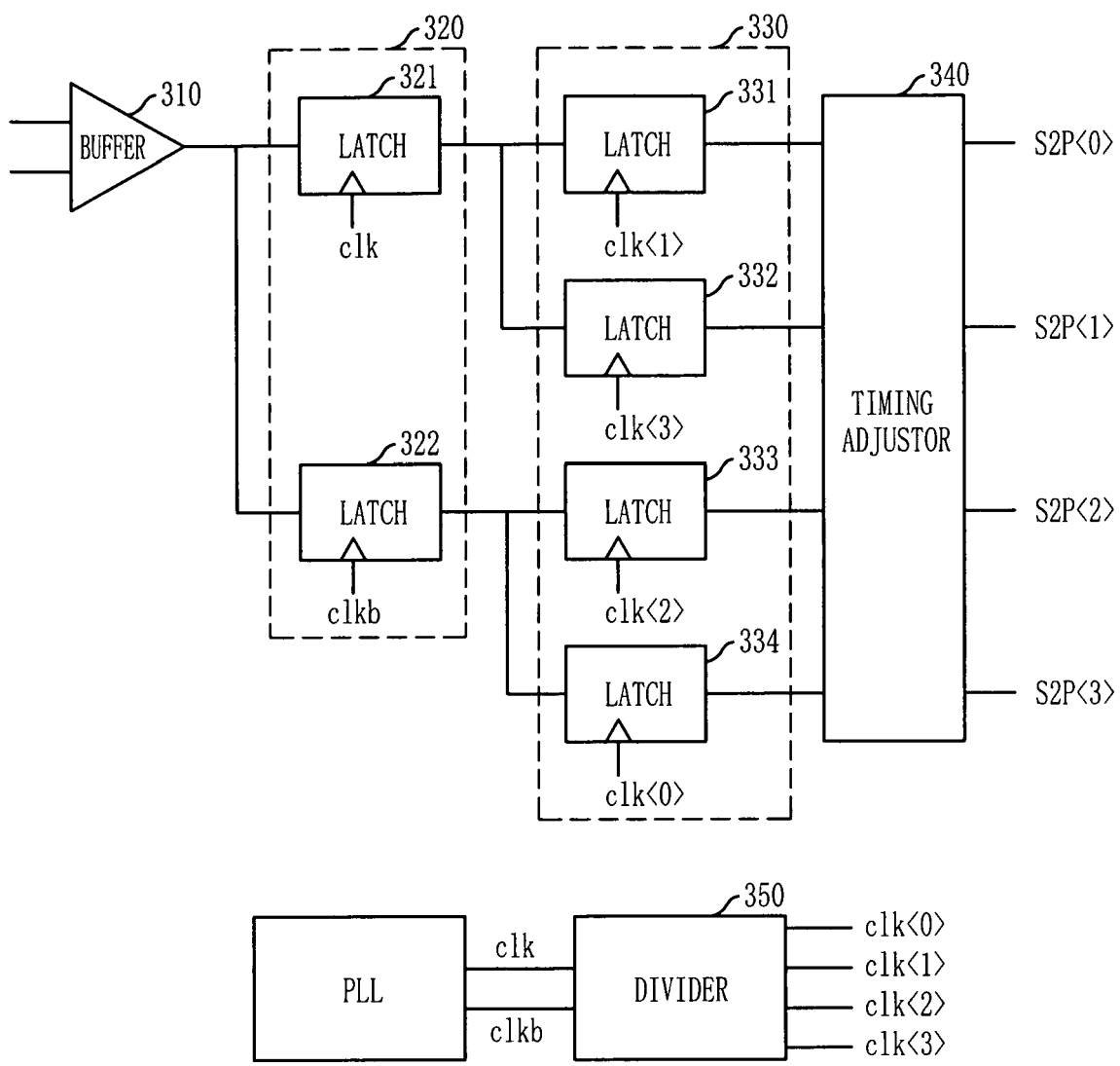
FIG. 3 is a configuration diagram illustrating a circuit for data alignment in accordance with a preferred embodiment of the present invention.

FIG. 3 is a configuration diagram illustrating a circuit for data alignment in accordance with a preferred embodiment of the present invention.

As shown in FIG. 3, the circuit for data alignment in accordance with the present invention includes a first latch unit 320 for latching serial input data by using a plurality of first clocks clk and clkb with different phases and the same frequency to output latched data, and a second latch unit 330 for latching the data from the first latch unit 320 in response to a plurality of second clocks clk<0>, clk<1>, clk<2>, and clk<3> with a lower frequency than the first clocks clk and clkb and more diverse phases to thereby output parallel data. Further included is a timing adjustor 340 which adjusts the timing of the parallel data from the second latch unit 330 to output aligned data.

More specifically, the first latch unit 320 serves to initially latch serial input data provided through a buffer 310, etc., that is, latches the same by using a plurality of first clocks with different phases and the same frequency. In the conventional circuit for data alignment, four clocks with different phases were used for parallelizing data in the ratio of 1:4. However, the first latch unit of the present invention employs only two clocks, rather than four clocks, for the same purpose. That is, in case of parallelizing data in the ratio of 1:N, the first latch unit 320 uses a smaller number of clocks than N, rather than using an N-number of clocks like the conventional circuit. In this case, since the first clocks clk and clkb used in the first latch unit 320 have only two phases, it is not required to use low frequency clocks, as in the conventional circuit. Therefore, it is possible to solve the prior art problem that the jitter characteristics of clocks are degraded by using the low frequency clocks.

As shown in the drawing, the first latch unit 320 is provided with the same number of latches as the first clocks clk and clkb, i.e., two latches 321 and 322, which are operated when the first clocks clk and clkb and the data are inputted.

The second latch unit 330 latches the data from the first latch unit 320 in response to a plurality of second clocks clk<0>, clk<1>, clk<2>, and clk<3> with a lower frequency than the first clocks clk and clkb (i.e., with a long period) and more diverse phases, to output latched data in parallel. That is, the second latch unit 330 latches data by using an N-number of clocks in order to parallelize data in the ratio of 1:N, as in the conventional circuit. Since the second latch unit 330 has to use the second clocks clk<0>, clk<1>, clk<2>, and clk<3> with more diverse phases than those of the first latch unit 320, the frequency of the second clocks clk<0>, clk<1>, clk<2>, and clk<3> used in the second latch unit 330 becomes low, but the data are latched again by using the latch result of the first latch unit 320 that is just the front stage thereof. Therefore, although the jitter characteristics of clocks are slightly bad, there is no problem in the second latch unit 330.

As shown in the drawing, the second latch unit 330 is provided with the same number of latches as the second clocks clk<0>, clk<1>, clk<2>, and clk<3>, i.e., four latches 331, 332, 333, and 334, which are operated when the second clocks clk<0>, clk<1>, clk<2>, and clk<3> and the data from the first latch 320 are inputted.

The circuit for data alignment in accordance with the present invention is characterized in that it further includes a divider 350 for dividing the first clocks clk and clkb from the PLL to generate the second clocks clk<0>, clk<1>, clk<2>, and clk<3>. In this case, it takes only two (or a smaller number than N) clocks, rather than taking four clocks (or N number) from the PLL like the conventional circuit. Thus, it is possible to reduce the number of lines for accepting clocks. This solves the problem of poor skew of clocks due to coupling noise between lines and leads to a reduction in the size of the overall circuit by the reduced number of lines.

Figure 1:
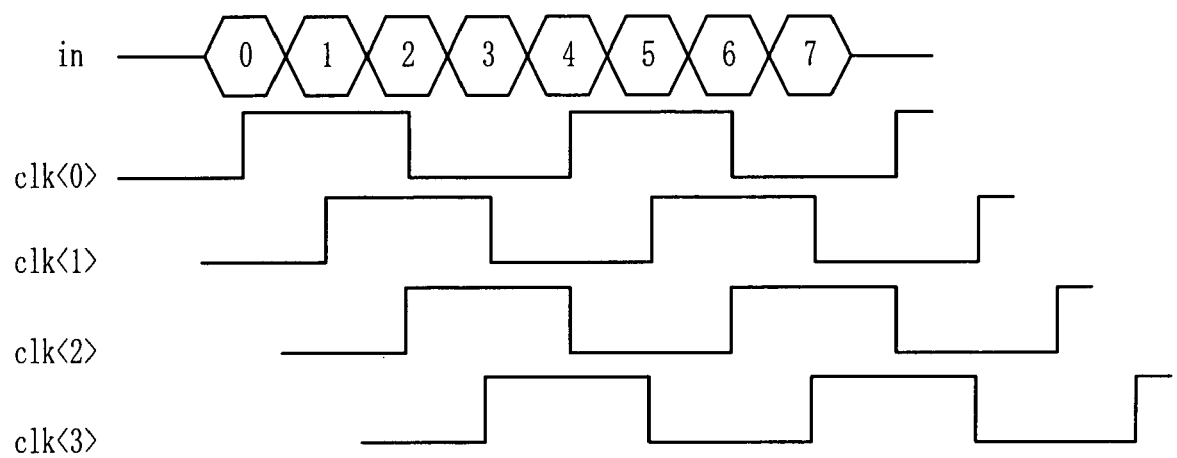
FIG. 1 shows that four clocks with different phases latch serial input data.
Figure 2:
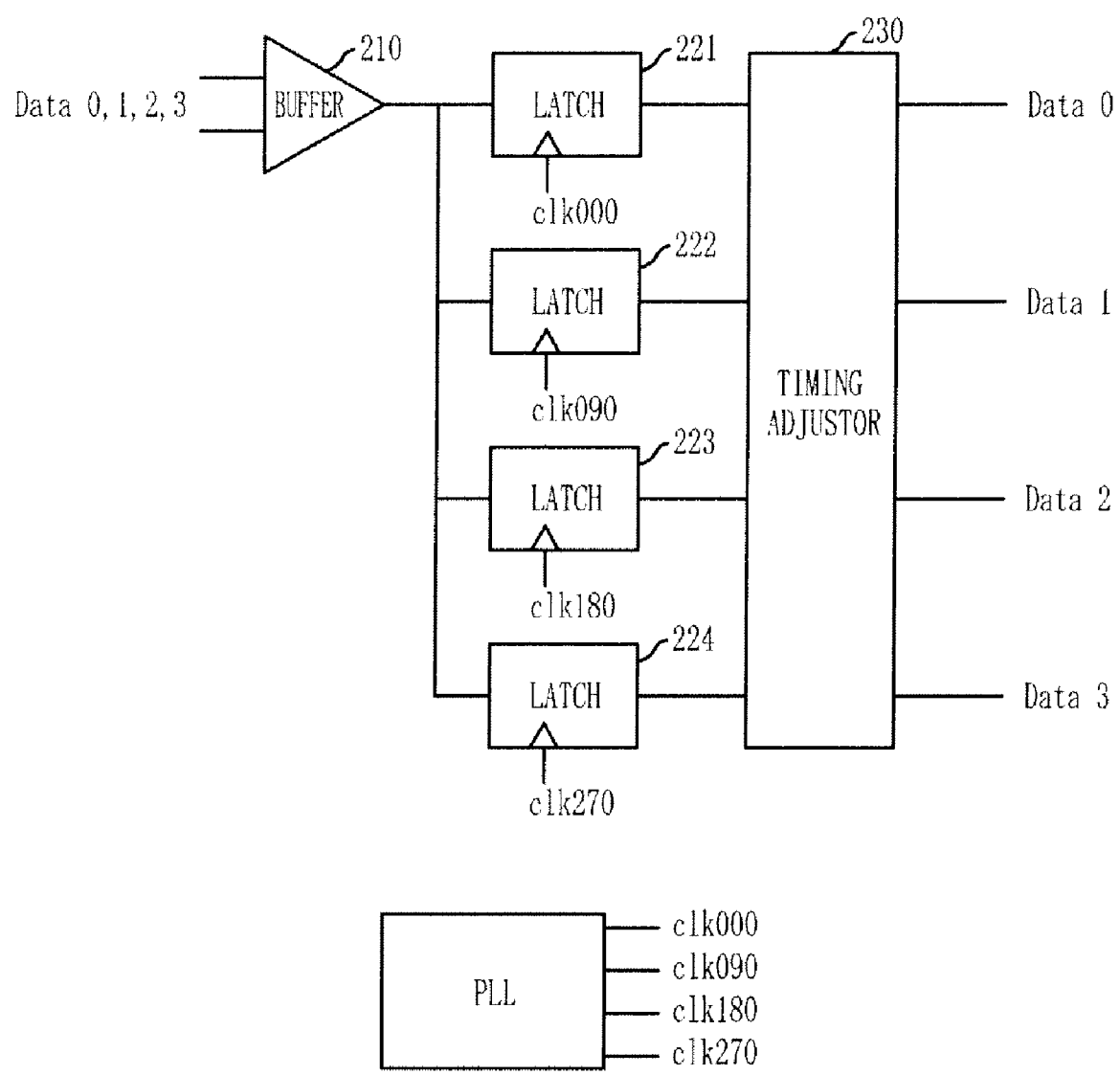
FIG. 2 is a configuration diagram illustrating a conventional circuit for data alignment.

The timing adjustor 340, which adjusts the timing of data having been already parallelized in the second latch unit 330, outputs the parallelized data at the same time by adjusting the delay of data. For example, in case serial data is parallelized in the ratio of 1:4, four data are simultaneously outputted. The timing adjustor 340 is the same as the existing timing adjustor (230 of FIG. 2), not a newly added component in the present invention. Therefore, details thereof will be omitted here.

Figure 4A:
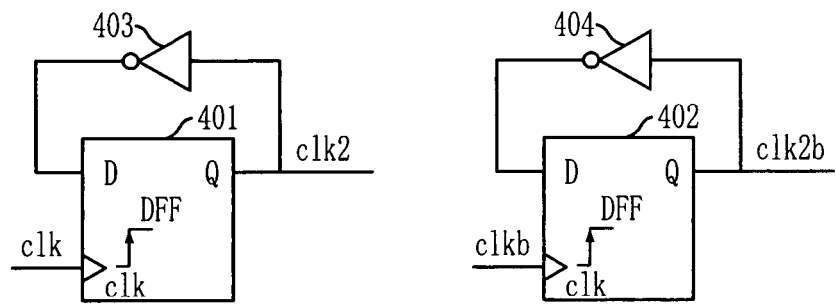
Figure 4B:
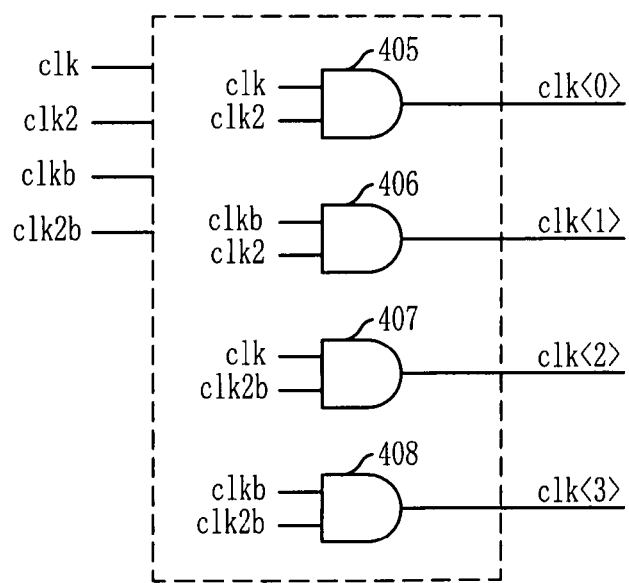
Figure 4C:
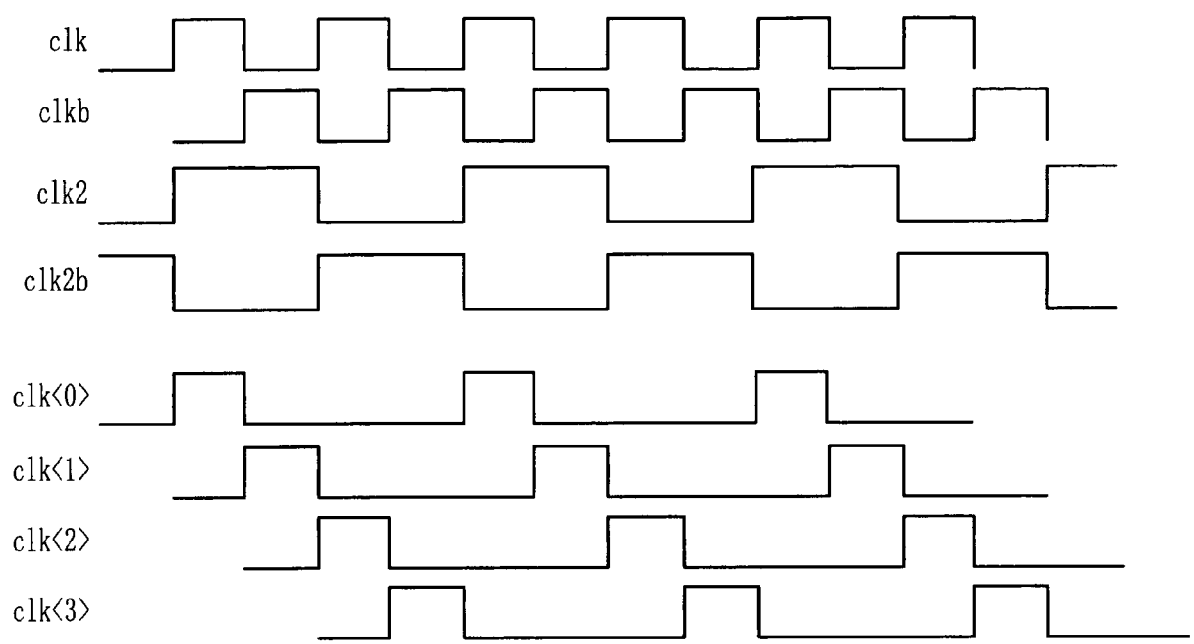

FIGS. 4A, 4B, and 4C are detailed diagrams of the divider 350 shown in FIG. 3, in which FIG. 4A is a circuit diagram for frequency conversion, FIG. 4B is a circuit diagram for phase conversion, and FIG. 4C describes the overall operation of the divider.

FIG. 4A illustrates a circuit which generates clocks clk2 and clk2b with half frequency of the first clocks clk and clkb by using the first clocks. This may be configured by combining D flip-flops 401 and 402 and inverters 403 and 404, as well-known in the art. The timing of clocks clk, clkb, clk2, and clk2b inputted/outputted thereto/therefrom is shown in FIG. 4C.

FIG. 4B illustrates a circuit which generates second clocks clk<0>, clk<1>, clk<2>, and clk<3> with diverse phases by utilizing the clocks clk2 and clk2b generated by the circuit of FIG. 4A. The second clocks clk<0>, clk<1>, clk<2>, and clk<3> with diverse phases can be generated by AND gates 405, 406, 407, and 408 which logically combine the first clocks clk and clkb and clocks clk2 and clk2b, respectively. The timing of clocks clk, clkb, clk2, clk2b, clk0, clk1, clk2, and clk3 inputted/outputted to/from the AND gates 405, 406, 407, and 408 is shown in FIG. 4C.

Figure 5:
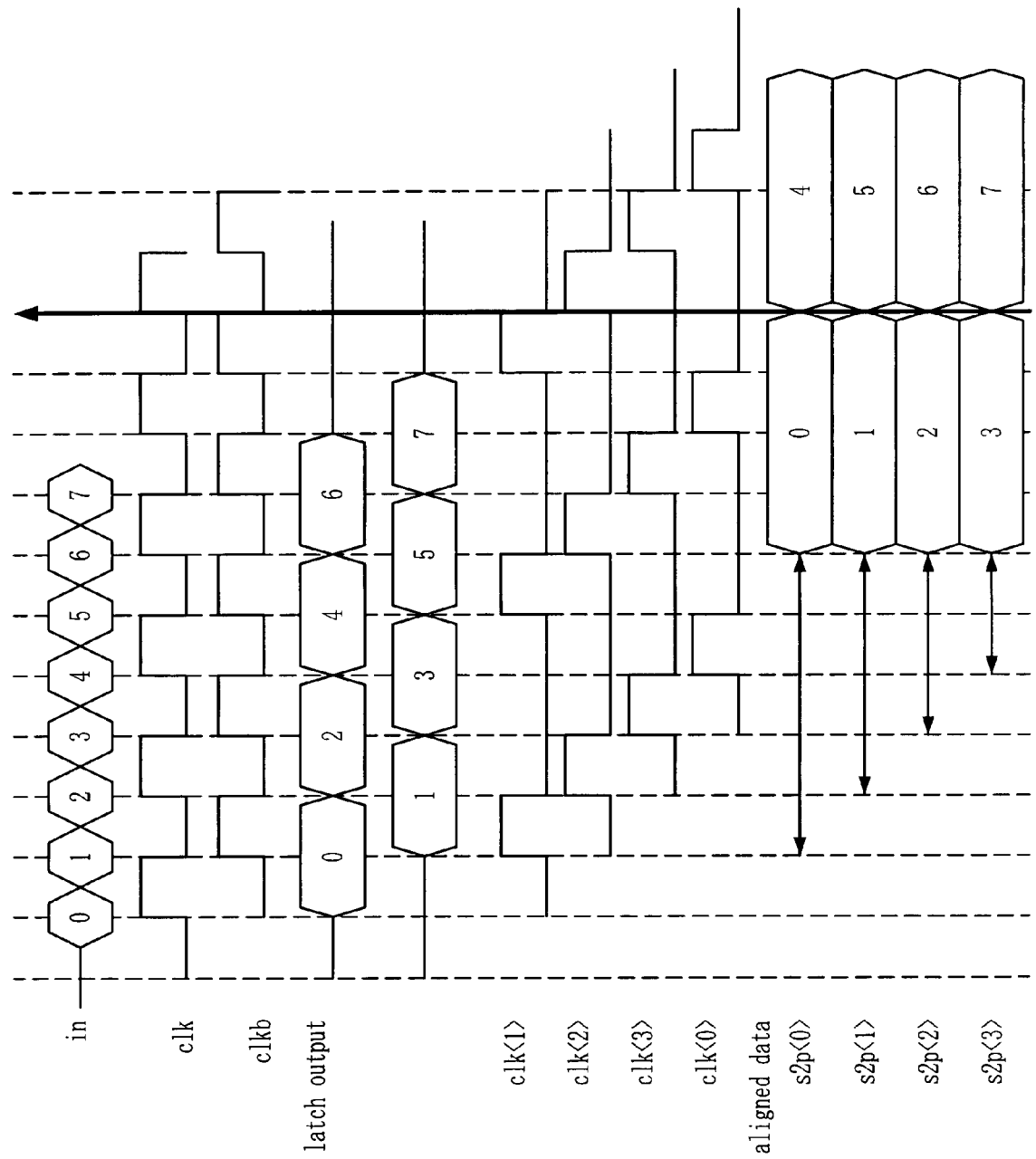
FIG. 5 is a timing diagram showing the overall operation of the circuit for data alignment of FIG. 3.

FIG. 5 is a timing diagram describing the overall operation of the circuit for data alignment of FIG. 3.

As depicted in the drawing, when data 0, 1, 2, 3, 4, 5, 6, and 7 are sequentially inputted in series, the first latch unit latches the data 0, 2, 4, and 6 by using the first clock clk, and latches the data 1, 3, 5, and 7 by using the clock clkb. Next, the second latch unit latches the data 0, 1, 2, and 3 by the second clocks clk<0>, clk<1>, clk<2>, and clk<3>. Then, the timing adjustor adjusts the data to thereby align and output the same in parallel. There is presented the 1:4 parallelizing process, and thus, the data 0, 1, 2, and 3 are first outputted in parallel and then the data 4, 5, 6, and 7 are outputted in parallel.

Now, a method for data alignment in accordance with the present invention will be described with reference to FIGS. 3 and 5 again. The method of aligning serial data into parallel data is achieved by including the steps of a) latching serial input data by using a plurality of first clocks clk and clkb with different phases and the same frequency; and b) latching the data latched in the step a) by using a plurality of second clocks clk<0>, clk<1>, clk<2>, and clk<3> with a lower frequency than the first clocks clk and clkb and more diverse phases to thereby output latched data in parallel.

Preferably, the method for data alignment may further include the step of dividing the first clocks clk and clkb to generate the second clocks clk<0>, clk<1>, clk<2>, and clk<3>.

In addition, the method for data alignment may further include the step of adjusting the timing of the parallel data outputted from the step b) to align the data.

As described above, the present invention can solve the problem of poor jitter characteristics of clocks caused by using low frequency clocks, as in the prior art, because a first latch unit first latches data by using high frequency clocks.

In addition, since the present invention receives a small number of clocks compared to the prior art when taking them from an external circuit such as a PLL, it is possible to reduce the number of lines for transferring the clocks. This can solve the problem of bad skew due to coupling noise between the lines and leads to a reduction in the area of the overall circuit by the reduced number of lines.

While the present invention has been described with respect to the specific embodiments, it will be apparent to those skilled in the art that various changes and modifications may be made without departing from the spirit and scope of the invention as defined in the following claims.

What is claimed is:

1. A circuit for data alignment, comprising:
   a first latch unit for latching serial input data by using a plurality of first clocks with different phases and a same frequency to output latched data; and
   a second latch unit for latching the data from the first latch unit by using a plurality of second clocks with a lower frequency and more diverse phases than the first clocks to thereby output parallel data.

2. The circuit for data alignment of claim 1, wherein the number of the second clocks are more than that of the first clocks.

3. The circuit for data alignment of claim 1, wherein the first clocks include clocks and inverted clocks provided from outside.

4. The circuit for data alignment of claim 3, wherein the second clocks are generated by dividing the first clocks.

5. The circuit for data alignment of claim 4, further comprising a divider for dividing the first clocks to generate the second clocks.

6. The circuit for data alignment of claim 1, wherein the first latch unit includes a same number of latches as the first clocks, which are operated when the first clocks and the data are inputted.

7. The circuit for data alignment of claim 6, wherein the second latch unit includes a same number of latches as the second clocks, which are operated when the second clocks and the data from the first latch unit are inputted.

8. The circuit for data alignment of claim 1, further comprising a timing adjustor for adjusting the timing of the parallel data outputted from the second latch unit to align the parallel data.

9. A circuit for data alignment, comprising:
   a first latch unit for latching serial input data by using clock and inverted clocks from outside to output latched data; and
   a second latch unit for latching the data from the first latch unit by using four second clocks with half frequency of the clocks and different phases to thereby output parallel data.

10. The circuit for data alignment of claim 9, further comprising a divider for dividing the clocks and the inverted clocks to generate the second clocks.

11. The circuit for data alignment of claim 10, wherein the divider includes:
    a plurality of D flip-flops for generating, by using the clocks and the inverted clocks, half-frequency clocks of the clocks; and
    a plurality of AND gates for adjusting the phases of the clocks from the D flip-flops.

12. The circuit for data alignment of claim 9, wherein the first latch unit includes two latches for latching the data in response to the clocks and the inverted clocks, and
    the second latch unit includes four latches for latching the data from the first latch unit in response to the four second clocks, respectively.

13. The circuit for data alignment of claim 9, further comprising a timing adjustor for adjusting the timing of the parallel data outputted from the second latch unit to align the parallel data.

14. A method for data alignment, comprising:
    latching serial input data in a first latch unit using a plurality of first clocks with different phases and a same frequency; and
    latching the data latched in the first latch unit by using a plurality of second clocks with a lower frequency and more diverse phases than the first clocks to thereby output parallel data.

15. The method for data alignment of claim 14, wherein the first clocks include clocks and inverted clocks inputted from the outside.

16. The method for data alignment of claim 15, further comprising dividing the first clocks to generate the second clocks.

17. The method for data alignment of claim 14, further comprising adjusting the timing of the parallel data outputted from the latching of the data latched in the first latch unit to align the parallel data.

* * * * *